(12) United States Patent
Oh

(10) Patent No.: US 12,384,138 B2
(45) Date of Patent: Aug. 12, 2025

(54) DISPLAY DEVICE AND METHOD OF REPLACING WINDOW MODULE OF DISPLAY DEVICE

(71) Applicant: Samsung Display Co., Ltd., Yongin-Si (KR)

(72) Inventor: Young Eun Oh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 430 days.

(21) Appl. No.: 17/337,910

(22) Filed: Jun. 3, 2021

(65) Prior Publication Data
US 2022/0063259 A1    Mar. 3, 2022

(30) Foreign Application Priority Data

Aug. 27, 2020 (KR) ........................ 10-2020-0108307

(51) Int. Cl.
| | |
|---|---|
| *B32B 27/30* | (2006.01) |
| *B32B 7/12* | (2006.01) |
| *B32B 17/10* | (2006.01) |
| *B32B 27/28* | (2006.01) |
| *G06F 1/16* | (2006.01) |
| *H10K 71/00* | (2023.01) |
| *B32B 43/00* | (2006.01) |

(52) U.S. Cl.
CPC .............. *B32B 27/306* (2013.01); *B32B 7/12* (2013.01); *B32B 17/10* (2013.01); *B32B 27/281* (2013.01); *G06F 1/1652* (2013.01); *H10K 71/861* (2023.02); *B32B 43/006* (2013.01); *B32B 2307/42* (2013.01); *B32B 2457/20* (2013.01)

(58) Field of Classification Search
CPC ......... B32B 27/306; B32B 7/12; B32B 17/10; B32B 27/281; B32B 43/006; B32B 2307/42; B32B 2457/20; B32B 43/00; B32B 17/10807; B32B 37/1207; G06F 1/1652; G06F 1/1637; G06F 1/1641; H10K 71/861; H10K 59/12; H10K 50/8426; H10K 71/00; H10K 50/844; H10K 50/86; G09F 9/30

See application file for complete search history.

(56) References Cited

U.S. PATENT DOCUMENTS

| | | | | |
|---|---|---|---|---|
| 2012/0327341 A1* | 12/2012 | Honda | .............. | G02F 1/133308 349/122 |
| 2016/0002103 A1* | 1/2016 | Wang | ................. | B23K 26/0624 428/141 |
| 2016/0202842 A1* | 7/2016 | Uriu | ...................... | G06F 3/0445 345/175 |
| 2018/0348567 A1* | 12/2018 | Shin | ................... | H01L 27/1262 |

(Continued)

FOREIGN PATENT DOCUMENTS

| | | |
|---|---|---|
| KR | 1020160014873 A | 2/2016 |
| KR | 1020170068823 A | 6/2017 |

(Continued)

*Primary Examiner* — John D Freeman
(74) *Attorney, Agent, or Firm* — CANTOR COLBURN LLP

(57) ABSTRACT

A display device includes a display panel, a thin glass layer disposed on the display panel, a hot melt adhesive layer disposed between the display panel and the thin glass layer, and a functional film disposed between the hot melt adhesive layer and the thin glass layer.

15 Claims, 11 Drawing Sheets

(56) References Cited

U.S. PATENT DOCUMENTS

2018/0366661 A1* 12/2018 Wang .................. H10K 77/111
2018/0371196 A1   12/2018 Park et al.
2020/0012130 A1    1/2020 Tamada et al.
2020/0342789 A1   10/2020 Park et al.

FOREIGN PATENT DOCUMENTS

| KR | 1020190121798 A | 10/2019 |
| KR | 102068729 B1 | 1/2020 |
| KR | 1020200010710 A | 1/2020 |

* cited by examiner

DISPLAY DEVICE AND METHOD OF REPLACING WINDOW MODULE OF DISPLAY DEVICE

This application claims priority to Korean Patent Application No. 10-2020-0108307, filed on Aug. 27, 2020, and all the benefits accruing therefrom under 35 U.S.C. § 119, the content of which in its entirety is herein incorporated by reference.

BACKGROUND

1. Field

Embodiments of the invention relate to a display device and a method of replacing a window module in a display device.

2. Description of the Related Art

A display device includes a display screen to display image information to a user. In general, the display device displays information within a given display screen. The display device is applied to various electronic devices, such as smart phones, laptop computers, and television sets.

SUMMARY

In certain cases, a display device may be damaged by an external impact, and in this case, a damaged layer of the display device may be repaired or replaced. That is, a method capable of simply and economically replacing the damaged layer is desired to increase safety and convenience of users. Furthermore, the display device is desired to allow for such simple and economical replacement of the damaged layer.

An embodiment of the invention provides a display device, which simply and economically replace a window module without damage of a display panel.

An embodiment of the invention provides a method of simply and economically replacing a window module, which is provided as a part of a display device, without damage of a display panel.

In an embodiment of the invention, a display device includes a display panel, a thin glass layer disposed on the display panel, a hot melt adhesive layer disposed between the display panel and the thin glass layer, and a functional film disposed between the hot melt adhesive layer and the thin glass layer.

In an embodiment, the hot melt adhesive layer may have a melting temperature of about 85 degrees Celsius (° C.) or higher.

In an embodiment, the hot melt adhesive layer may have an optical transmittance of about 80 percent (%) or higher.

In an embodiment, the hot melt adhesive layer may have a thickness of about 1 micrometer (μm) or greater.

In an embodiment, the thin glass layer may have a thickness of about 25 μm to about 1 millimeter (mm).

In an embodiment, the functional film may include a protection film or a polarization film.

In an embodiment, the display panel may be flexible.

In an embodiment of the invention, a display device includes a display panel, a thin glass layer disposed on the display panel, a hot melt adhesive layer disposed between the display panel and the thin glass layer, a first functional film in contact with a first surface of the hot melt adhesive layer facing the thin glass layer, and a second functional film in contact with a second surface of the hot melt adhesive layer opposite to the first surface of the hot melt adhesive layer.

In an embodiment, the hot melt adhesive layer may have a melting temperature of about 85° C. or higher.

In an embodiment, the hot melt adhesive layer may have an optical transmittance of about 80% or higher.

In an embodiment, the hot melt adhesive layer may have a thickness of about 1 μm or thicker.

In an embodiment, the thin glass layer may have a thickness of about 25 μm to about 1 mm.

In an embodiment, each of the first functional film and the second functional film may include at least one of a protection film and a polarization film.

In an embodiment, the first functional film and the second functional film may include a same material.

In an embodiment, the display panel may include a substrate, a circuit layer disposed on the substrate, a light-emitting element layer disposed on the circuit layer, and an encapsulation layer disposed on the light-emitting element layer.

In an embodiment of the invention, a method of replacing window module includes heating a display device including a display panel, a window module, and a first hot melt adhesive layer, which bonds the display panel and the window module, to melt the first hot melt adhesive layer, removing the window module from the display panel, providing a new window module including a second hot melt adhesive layer, on the display panel, and heating the new window module, which is disposed on the display panel, to melt the second hot melt adhesive layer. The second hot melt adhesive layer is consolidated to bond the display panel and the new window module.

In an embodiment, the first hot melt adhesive layer and the second hot melt adhesive layer may include the same material.

In an embodiment, the heating the display device and the heating the new window module may be performed to have a heating temperature of about 85° C. to about 120° C.

In an embodiment, each of the window module and the new window module may include a thin glass layer and a first functional film, which is disposed on a surface of the thin glass layer facing the display panel. The thin glass layer may not be in contact with the first and second hot melt adhesive layers.

In an embodiment, the method may further include a second functional film on the display panel. The first and second hot melt adhesive layers and the display panel may not be in contact with each other.

BRIEF DESCRIPTION OF THE DRAWINGS

Embodiments will be more clearly understood from the following brief description taken in conjunction with the accompanying drawings. The accompanying drawings represent non-limiting, embodiments as described herein.

DETAILED DESCRIPTION

Figure 1A:
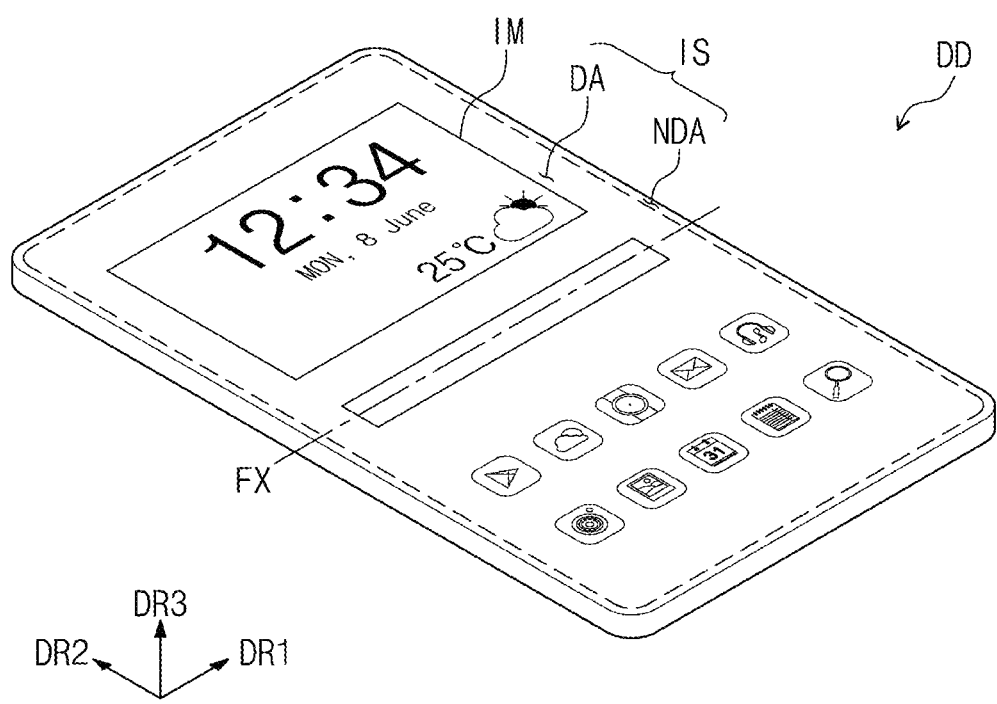
FIG. 1A is a perspective view illustrating an embodiment of a display device according to the invention.

Embodiments of the invention will now be described more fully with reference to the accompanying drawings, in which embodiments are shown. Embodiments of the invention may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is also referred to as being "connected" or "coupled" to another element, it may be directly connected or coupled to the other element or intervening elements may be present. In contrast, when an element is also referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It should be noted that the drawing figures are intended to illustrate the general characteristics of methods, structure and/or materials utilized in certain embodiments and to supplement the written description provided below. The drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

The terminology used herein is for the purpose of describing particular embodiments only and is not intended to be limiting of embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments of the invention are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
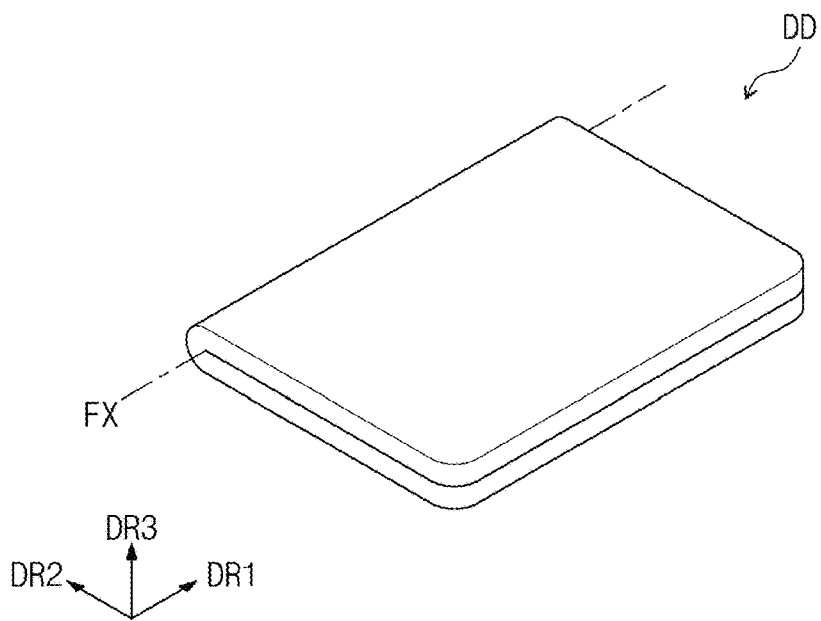
FIG. 1B is a perspective view illustrating an embodiment of a folding state of the display device of FIG. 1A.
Figure 1C:
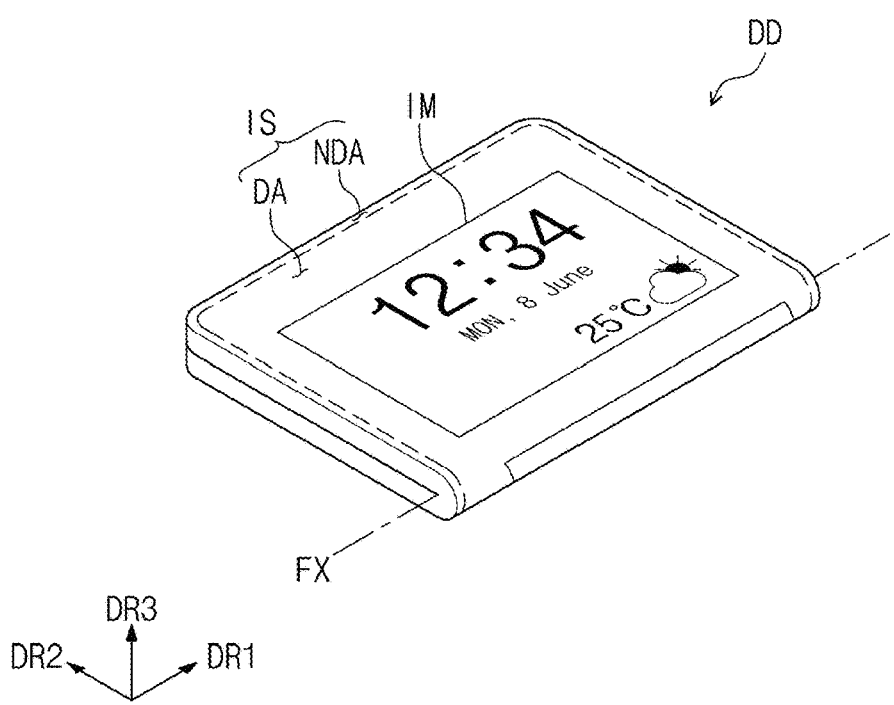
FIG. 1C is a perspective view illustrating another embodiment of a folding state of the display device of FIG. 1A.

FIG. 1A is a perspective view illustrating an embodiment of a display device according to the invention. FIGS. 1B and 1C are perspective views illustrating embodiments of a folding state of the display device of FIG. 1A.

Referring to FIG. 1A, a display device DD may have a quadrangular (e.g., rectangular) shape, including short sides parallel to a first direction DR1 and long sides parallel to a second direction DR2 crossing the first direction DR1. A top surface of the display device DD may be defined as a display surface IS. In an embodiment, the display surface IS may be defined to be parallel to both of the first and second directions DR1 and DR2. However, the shape of the display device DD is not limited to this embodiment and is variously changed.

The display surface IS may include a display region DA and a non-display region NDA around the display region DA. The display region DA may be a region, on which an image IM is displayed, and the non-display region NDA may be a region, which is not used to display the image. The image IM may be a video image or a still image. In FIGS. 1A and 1C, a plurality of application icons is illustrated as an embodiment of the image IM.

The display region DA may be quadrangular (e.g., rectangular). The non-display region NDA may enclose the display region DA. However, the invention is not limited to this embodiment, and the shapes of the display and non-display regions DA and NDA may be designed to have other shapes. In an alternative embodiment, the non-display region NDA may be disposed near one of side regions of the display region DA or may be omitted.

In the illustrated embodiment, a front or top surface and a rear or bottom surface of each element may be distinguished, based on the display direction of the image IM. The top surface and the bottom surface may be opposite to each other in a third direction DR3, and a direction normal to each of the top and bottom surfaces may be parallel to the third direction DR3.

However, directions indicated by the first to third directions DR1, DR2, and DR3 may be relative concept, and in an embodiment, they may be changed to indicate other directions. Hereinafter, first to third directions may be directions indicated by the first to third directions DR1, DR2, and DR3, respectively, and will be referenced with the same numerals.

Referring to FIGS. 1A to 1C, the display device DD in an embodiment of the invention may be foldable. The foldable property may mean a property of an element, which may be folded, bended, or curved to have a curvature radius that is extremely small or several nanometers. However, the invention is not limited to this, and the display device DD may be a rigid display device or a bended display device, in which a bended display surface is provided in a fixed manner.

The display device DD may be used for large-sized electronic devices (e.g., television sets and monitors) or small- or medium-sized electronic devices (e.g., portable phones, tablets, game machines, and navigation systems). Furthermore, the display device DD may be used for curved or foldable electronic devices.

The display device DD may be in a non-folding state, in which the display device DD is not folded or is flat, or may be in an in-folding or out-folding state, in which the display device DD is inwardly or outwardly folded along a folding axis FX. FIG. 1A illustrates the display device DD in the non-folding state. FIG. 1B illustrates the display device DD of FIG. 1A, which is in the in-folding state, and FIG. 1C illustrates the display device DD shown in FIG. 1A, which is in the out-folding state.

Referring to FIG. 1B, the display device DD may be folded in an in-folding manner along the folding axis FX. In the case where the display device DD is in the in-folding state, the display surface IS of the display device DD may be folded such that two portions thereof face each other, and the rear surface opposite to the display surface IS may be exposed to the outside. Thus, it may be possible to protect the display surface IS of the display device DD from external environment.

Referring to FIG. 1C, the display device DD may be folded in an out-folding manner along the folding axis FX. In the case where the display device DD is in the out-folding state, the rear surface of the display device DD may be folded such that two portions thereof face each other, and the display surface IS may be exposed to the outside. Thus, the image IM may be provided to a user through the display surface IS, even when the display device DD is in the folded state.

The folding axis FX may be extended parallel to a direction of the display device DD. The folding axis FX may be defined to be parallel to the short side of the display device DD, as shown in FIGS. 1A to 1C. However, the invention is not limited to this, and it may be defined to be parallel to the long side of the display device DD.

The display device DD may include a folding region which may be deformed along the folding axis FX. As shown in FIGS. 1B and 1C, one folding region may be defined in in the display device DD. However, the invention is not limited to this embodiment, and a plurality of folding regions may be defined in the display device DD.

The display device DD may display the image IM (e.g., refer to FIG. 1) and to sense an external input. An embodiment of the external input is an input provided from a user. In an embodiment, the user's input may include various types of external inputs, such as a portion of the user's body, a pen, light, heat, or pressure. The display device DD may sense the user's input, which is provided to a display surface IS, but the invention is not limited to this embodiment. In an embodiment, depending on the structure of the display device DD, the display device DD may sense an external input provided to a side or rear surface of the display device DD, for example.

Figure 2:
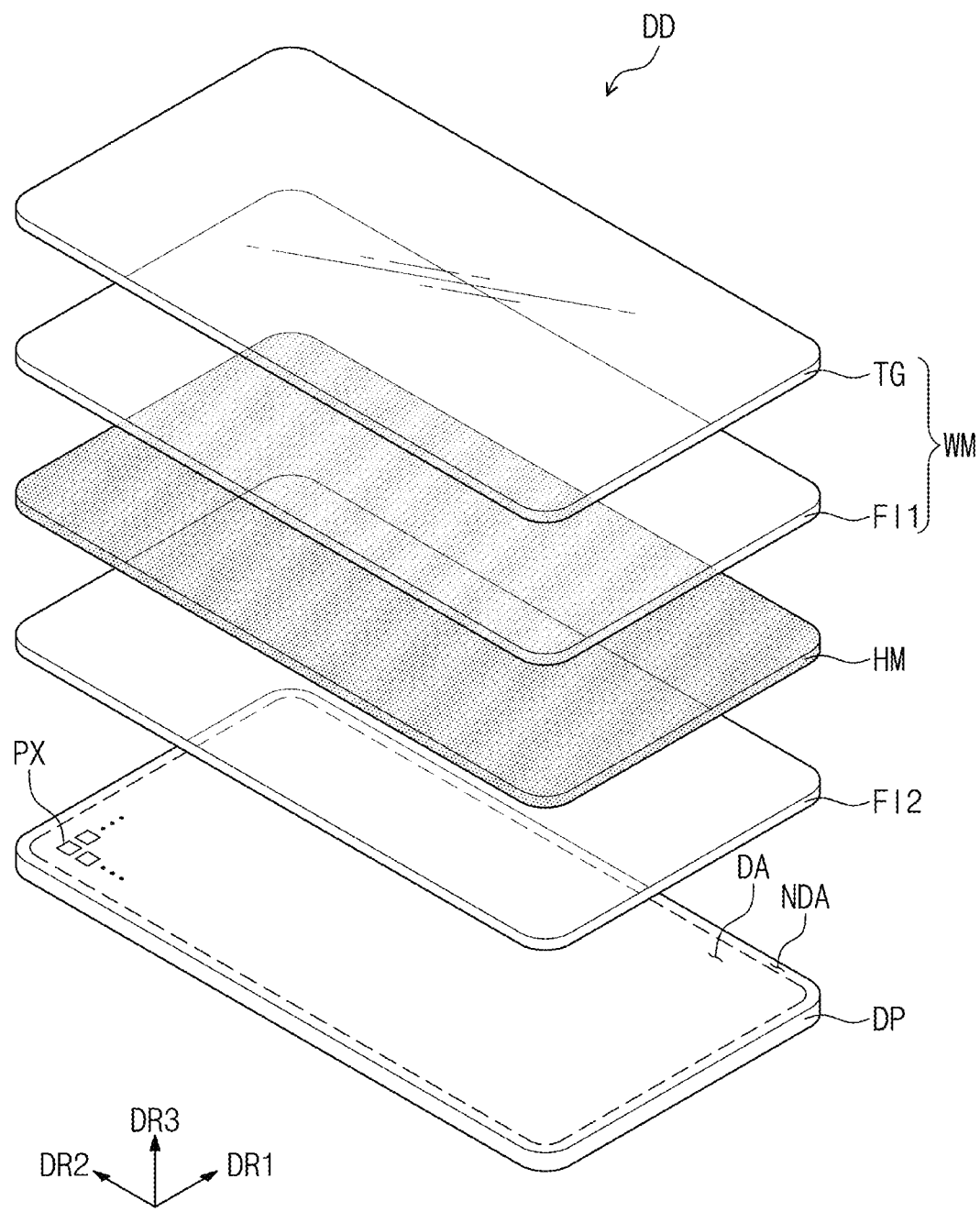
FIG. 2 is an exploded perspective view of an embodiment of a display device according to the invention.

FIG. 2 is an exploded perspective view of an embodiment of a display device according to the invention. The display device DD may include a display panel DP, a thin glass layer TG, a first functional film FI1, a hot melt adhesive layer HM, and a second functional film FI2. In the illustrated embodiment, the thin glass layer TG and the first functional film FI1 may constitute a window module WM. The display panel DP, the second functional film FI2, the hot melt adhesive layer HM, the first functional film FI1, and the thin glass layer TG may be sequentially stacked in the third direction DR3.

The display panel DP may be a light-emitting type display panel, but the invention is not limited to this embodiment. In an embodiment, the display panel DP may be a liquid crystal display panel, an organic electroluminescence display panel, or a quantum dot light-emitting display panel, for example.

The display panel DP may include a plurality of pixels PX and a plurality of driving circuits. The pixels PX may be disposed on the top surface of the display panel DP. The pixels PX may be disposed in a region corresponding to the display region DA of the display device DD, and the driving circuits may be disposed in a region corresponding to the non-display region NDA. The driving circuits may drive the pixels PX, and the pixels PX may produce the image IM (e.g., refer to FIG. 1A). That is, the image IM (e.g., refer to FIG. 1A) may be displayed through the display region DA of the display device DD.

Electronic elements for driving the pixels PX may be included in a circuit substrate (not shown). The circuit substrate (not shown) may be coupled to a region corresponding to the non-display region NDA of the display panel DP. However, the invention is not limited to this embodiment, and the electronic elements may be disposed (e.g., mounted) in the display panel DP. The invention is not limited to a specific embodiment of the display device DD.

The thin glass layer TG may be disposed on the display panel DP. The thin glass layer TG may protect structures placed under the thin glass layer TG from external scratch and impact. In addition, since the thin glass layer TG is transparent, an image produced in the display panel DP may be emitted to the outside and may be provided to a user. Furthermore, the thin glass layer TG may be advantageous in aesthetic and anti-scratch properties, compared with a window including a transparent plastic material.

The thin glass layer TG may be a tempered thin glass layer. In an embodiment, the thin glass layer TG may have a thickness of 1 millimeter (mm) or less, and in an embodiment, the thin glass layer TG may be an ultra-thin glass having a thickness of 30 micrometers (μm) or less, for example. In the case where the display device DD is folded, the thin glass layer TG may be easily folded in accordance with a change in shape of the display device DD and may allow the display device DD to have a reduced thickness and a reduced weight.

As shown, the thin glass layer TG may be a layer, the entirety of which is transparent. However, the invention is not limited to this embodiment, and in an embodiment, the thin glass layer TG may include a transparent region, which corresponds to the display region DA, and a colored region, which corresponds to the non-display region NDA and is printed, deposited, or colored with a color layer.

The first functional film FI1 may be disposed between the hot melt adhesive layer HM and the thin glass layer TG. The first functional film FI1 may be in contact with a top surface of the hot melt adhesive layer HM. Thus, the thin glass layer TG and the hot melt adhesive layer HM may not be in contact with each other by the first functional film FI1.

The first functional film FI1 may be an optically transparent film. The first functional film FI1 may include a protection film or a polarization film.

The protection film may be a flexible plastic film. The protection film may prevent the hot melt adhesive layer HM from being in contact with the thin glass layer TG. In addition, the protection film may absorb an impact exerted from the outside to protect the display panel DP. In an embodiment, the protection film may be a polyimide ("PI") film, a polyethylene terephthalate ("PET") film, and so forth, for example. However, the material for the protection film is not limited to these embodiments.

The polarization film may reduce reflectance of an external light to be incident from the outside. The polarization film may be an elongated synthetic resin film, on which light absorbing elements are adsorbed. The elongated synthetic resin film may absorb light having an electric field which vibrates in its elongation direction, and may allow light having an electric field which vibrates in a direction perpendicular to the elongation direction, to pass therethrough, and this may allow light passing through the elongated synthetic resin film to have a linear polarization. In an embodiment, the polarization film may be a polyvinylalcohol ("PVA") film, on which iodine compound is adsorbed, for example. However, the material for the polarization film is not limited to these embodiments.

The hot melt adhesive layer HM may be disposed between the thin glass layer TG and the display panel DP. The hot melt adhesive layer HM may be used to bond elements, which are respectively disposed on and under the hot melt adhesive layer HM. As shown in FIG. 2, the first functional film FI1 may be disposed on the top surface of the hot melt adhesive layer HM, and the second functional film FI2 may be disposed on the bottom surface of the hot melt adhesive layer HM. However, the invention is not limited to this embodiment, and in an alternative embodiment, the second functional film FI2 may be omitted. In this case, the bottom surface of the hot melt adhesive layer HM may be in contact with the display panel DP.

The hot melt adhesive layer HM may include a hot melt adhesive, in which a thermoplastic resin is provided as its main ingredient. Since the hot melt adhesive is melted at a predetermined temperature, the hot melt adhesive in a liquid state may be coated on and compressed against an adherend, and then, the hot melt adhesive may be consolidated at room temperature to be adhered to the adherend. In an embodiment, the hot melt adhesives may consist of or include at least one of ethylene-vinyl acetate ("EVA") copolymer, polyurethane ("PU"), thermoplastic polyurethane ("TPU"), polyether sulfone ("PES"), or polyamide ("PA"), but the invention is not limited to these embodiments, for example.

The hot melt adhesive layer HM may have a melting temperature of about 85 degrees Celsius (° C.) or higher. When the melting temperature of the hot melt adhesive layer HM is lower than about 85° C., the hot melt adhesive layer HM may have a weakened adhesion strength when the display device DD is exposed to high temperature environment for reliability evaluation.

The hot melt adhesive layer HM may have optical transmittance of about 80 percent (%) or higher. When the hot melt adhesive layer HM has low optical transmittance (e.g., lower than about 80%), the hot melt adhesive layer HM may affect a quality of an image provided from the display device DD to a user, because the hot melt adhesive layer HM is disposed between the display panel DP and the thin glass layer TG. Thus, the hot melt adhesive layer HM should have high optical transmittance and be optically transparent.

The hot melt adhesive layer HM may have a thickness of 1 μm or thicker along the third direction DR3. When the thickness of the hot melt adhesive layer HM is less than 1 μm, elements adhered to the hot melt adhesive layer HM may be easily detached from the hot melt adhesive layer HM, even at room temperature.

The window module WM of the display device DD may be damaged by an external impact and, in particular, the thin glass layer TG may be broken by the external impact. In an embodiment of the invention, since the display device DD includes the hot melt adhesive layer HM, it may be possible to easily and economically replace the window module WM, which are damaged by the external impact.

Referring to FIG. 2, the display device DD may include the second functional film FI2, which is disposed between the display panel DP and the hot melt adhesive layer HM. The second functional film FI2 may be in contact with the bottom surface of the hot melt adhesive layer HM. That is, in the illustrated embodiment, the display panel DP and the hot melt adhesive layer HM may not be in contact with each other by the second functional film FI2. However, the invention is not limited to this embodiment, and the display panel DP may be in contact with the hot melt adhesive layer HM.

The second functional film FI2 may be an optically transparent film. The second functional film FI2 may include a protection film or a polarization film. The second functional film FI2 may include a protection film, which protects the display panel DP from the hot melt adhesive layer HM or an external impact. The second functional film FI2 may include a polarization film, which reduces reflectance of an external light. The protection film and the polarization film in the second functional film FI2 may have substantially the same features as those in the first functional film FI1 described above.

Each of the first and second functional films FI1 and FI2 may include one of a protection film and a polarization film. The first and second functional films FI1 and FI2 may include films which include different materials from each other. In an embodiment, the first functional film FI1 may include a PET film, and the second functional film FI2 may include a PVA film, for example. However, the invention is not limited to this embodiment, and in an embodiment, the first and second functional films FI1 and FI2 may include films which include a same material as each other. In an embodiment, both of the first and second functional films FI1 and FI2 may include the PI film, for example.

The first and second functional films FI1 and FI2 may be disposed on the top and bottom surfaces of the hot melt adhesive layer HM, respectively, to prevent a melted portion of the hot melt adhesive layer HM from entering into an element, which constitutes the thin glass layer TG or the display panel DP, when the hot melt adhesive layer HM is melted.

In addition, in an operation of replacing the window module WM, the first functional film FI1 may prevent broken pieces of the thin glass layer TG from being mixed with a melted portion of the hot melt adhesive layer HM. That is, since the hot melt adhesive layer HM is spaced apart from the thin glass layer TG with the first functional film FI1 interposed therebetween, the window module WM may be more easily replaced with a new window module. A method of replacing the window module WM will be described in more detail with reference to FIGS. 10A to 10E.

Figure 3:
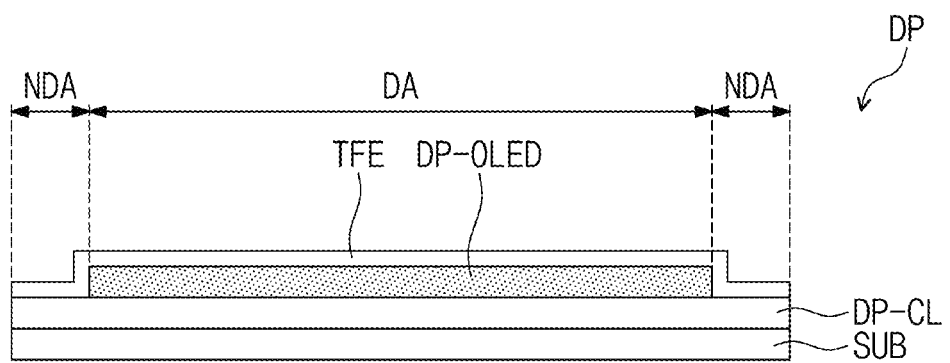
FIG. 3 is a cross-sectional view of an embodiment of a display panel according to the invention.
Figure 3:
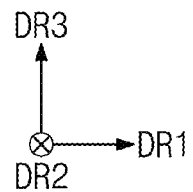

FIG. 3 is a cross-sectional view of an embodiment of a display panel according to the invention. The display panel DP may include a substrate SUB, a circuit layer DP-CL, a light-emitting element layer DP-OLED, and an encapsulation layer TFE.

The substrate SUB may be rigid or flexible. The substrate SUB may include a plastic substrate, an organic substrate, a metal substrate, or a substrate including an organic/inorganic composite material. The substrate SUB may include a synthetic resin film and may have a single- or multi-layered structure. In an embodiment, the synthetic resin film may consist of or include at least one of polyimide-based materials, acryl-based materials, vinyl-based materials, epoxy-based materials, urethane-based materials, cellulose-based materials, or perylene-based materials, for example, but the material for the synthetic resin film is not limited to these embodiments.

The circuit layer DP-CL may be disposed on the substrate SUB. The circuit layer DP-CL may include an insulating layer, a semiconductor pattern, a conductive pattern, a signal line, and so forth. The circuit layer DP-CL may include a plurality of transistors (not shown) composed of semiconductor patterns, conductive patterns, signal lines, and so forth. In an embodiment, the circuit layer DP-CL may include a switching transistor and a driving transistor to drive a light-emitting device, which is provided on the circuit layer DP-CL, for example.

The light-emitting element layer DP-OLED may be disposed on the circuit layer DP-CL. The light-emitting element layer DP-OLED may be disposed corresponding to the display region DA of the display device DD. The light-emitting element layer DP-OLED may include a light-emitting element. In an embodiment, the light-emitting element layer DP-OLED may include an organic light emitting material, quantum dots, quantum rods, micro-LED element, or nano-LED element, for example.

The encapsulation layer TFE may be disposed on the circuit layer DP-CL to cover the light-emitting element layer DP-OLED. The encapsulation layer TFE may include at least one of an inorganic layer and an organic layer. One embodiment of the encapsulation layer TFE may include the inorganic layers and an organic layer, which is disposed between the inorganic layers, but the layers constituting the encapsulation layer TFE are limited to this embodiments. The inorganic layer may protect the pixels from moisture or oxygen. The organic layer may protect the pixels from a contamination material, such as dust particles. In an embodiment, the inorganic layer may consist of or include at least one of silicon nitride, silicon oxide, silicon oxynitride, titanium oxide, or aluminum oxide, for example. The organic layer may consist of or include at least one of acrylic organic materials. However, the materials for the inorganic and organic layers are not limited to these embodiments.

In an embodiment, the display panel DP may further include a functional layer (not shown) disposed on the encapsulation layer TFE. In an embodiment, the functional layer may be an anti-reflection layer or an input-sensing layer or may be a multi-layered structure, in which an input-sensing layer and an anti-reflection layer are sequentially stacked, for example.

The input-sensing layer may include a plurality of insulating layers and a plurality of conductive layers. The plurality of conductive layers may be used to form a sensing electrode sensing an external input, a sensing line connected to the sensing electrode, and a sensing pad connected to the sensing line. The anti-reflection layer may be a functional layer reducing an external-light reflectance issue and preventing a color-mixing issue. The anti-reflection layer may include color filter parts, which are arranged in a predetermined arrangement, and a destructive interference structure.

Figure 4:
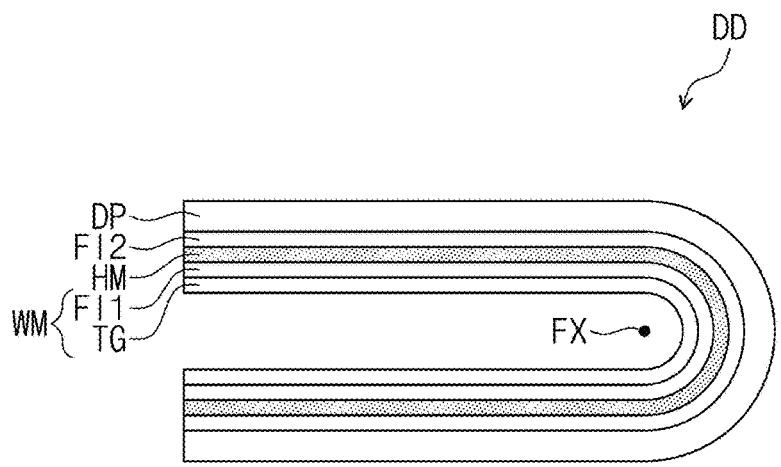
FIG. 4 is a cross-sectional view of the display device of FIG. 1B.
Figure 4:
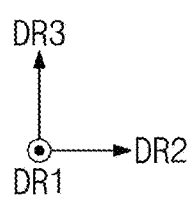

FIG. 4 is a cross-sectional view illustrating the folding state of the display device. The display device DD, in which the display panel DP, the second functional film FI2, the hot melt adhesive layer HM, the first functional film FI1, and the thin glass layer TG are sequentially stacked, may be folded in an in-folding and/or out-folding manner along the folding axis FX, and FIG. 4 illustrates a cross-sectional view of the display device DD in the in-folding state.

The hot melt adhesive layer HM may have a good adhesion strength property and may exhibit a good adhesion property to various kinds of adherends. Thus, even when the display device DD is maintained in the folded state or is repeatedly folded and unfolded, elements, which are disposed on and under the hot melt adhesive layer HM, may be robustly bonded to each other. However, the invention is not limited to the foldable display device and may be applied for a rigid or curved display device.

Figure 5:
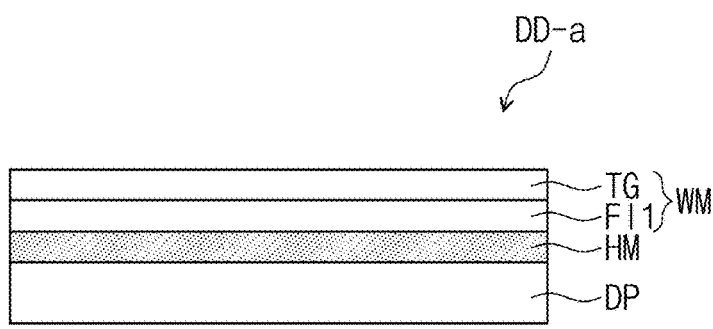
FIG. 5 is a cross-sectional view of an embodiment of a display device according to the invention.
Figure 5:
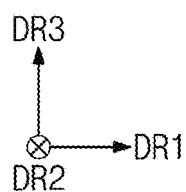
Figure 6:
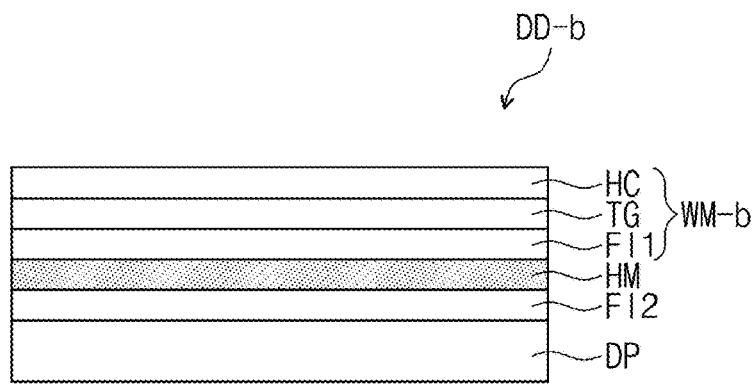
FIG. 6 is a cross-sectional view of an embodiment of a display device according to the invention.
Figure 6:
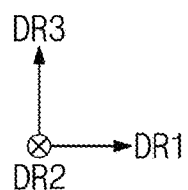
Figure 7:
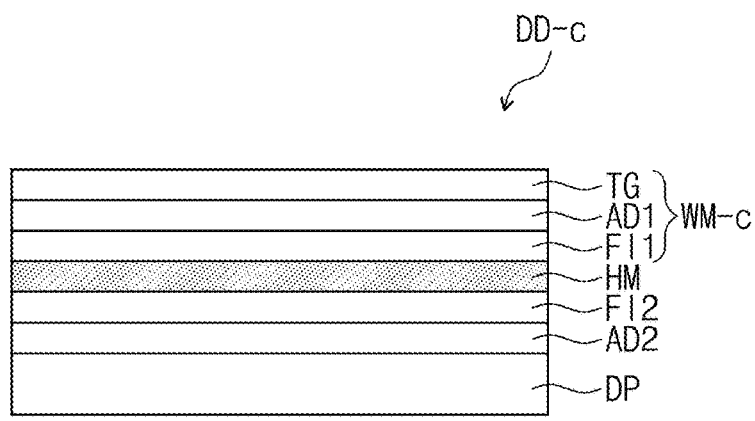
FIG. 7 is a cross-sectional view of an embodiment of a display device according to the invention.
Figure 7:
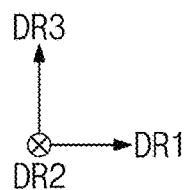

FIGS. 5 to 7 are cross-sectional views, each of which illustrates an embodiment of a display device according to the invention. An element may be further provided in the display devices of FIGS. 5 to 7 or may be omitted from the display devices of FIGS. 5 to 7. Hereinafter, such embodiments of the display device will be described in more detail with reference to FIGS. 5 to 7.

Referring to FIG. 5, in a display device DD-a, the second functional film FI2 in contact with a bottom surface of the hot melt adhesive layer HM may be omitted. Thus, the hot melt adhesive layer HM may be directly disposed on the display panel DP.

The hot melt adhesive layer HM may be in contact with the outermost element of the display panel DP. In an embodiment, the hot melt adhesive layer HM may be in contact with the encapsulation layer TFE (e.g., refer to FIG. 3) of the display panel DP, for example. In the case where a functional layer (not shown) (e.g., an input-sensing layer or an anti-reflection layer) is disposed on the encapsulation layer TFE, the hot melt adhesive layer HM may be in contact with a top surface of such a functional layer.

Referring to FIG. 6, a display device DD-b may include a window module WM-b, in which a coating layer HC is further disposed on the thin glass layer TG. The coating layer HC may be coated on a top surface of the thin glass layer TG to prevent the thin glass layer TG from being broken by an external impact. In addition, the coating layer HC may have an anti-fingerprint property and may prevent the thin glass layer TG from being contaminated by a user's fingerprint. The coating layer HC may consist of or include at least one of transparent insulating materials.

Referring to FIG. 7, a display device DD-c may include the window module WM-c, in which adhesion layers AD1 and AD2 are further provided. The first adhesion layer AD1 may be disposed between the first functional film FI1 and the thin glass layer TG and may bond the first functional film FI1 and the thin glass layer TG. The second adhesion layer AD2 may be disposed between the second functional film FI2 and the display panel DP and may bond the second functional film FI2 and the display panel DP.

Each of the adhesion layers AD1 and AD2 may consist of or include at least one of typical adhesive materials (e.g., pressure sensitive adhesives ("PSA"), optically clear adhesives ("OCA"), and optically clear resins ("OCR")). In an embodiment, each of the adhesion layers AD1 and AD2 may consist of or include at least one of acrylic-based resins or silicon-based resins, but the invention is not limited to these embodiments, for example.

Figure 8:
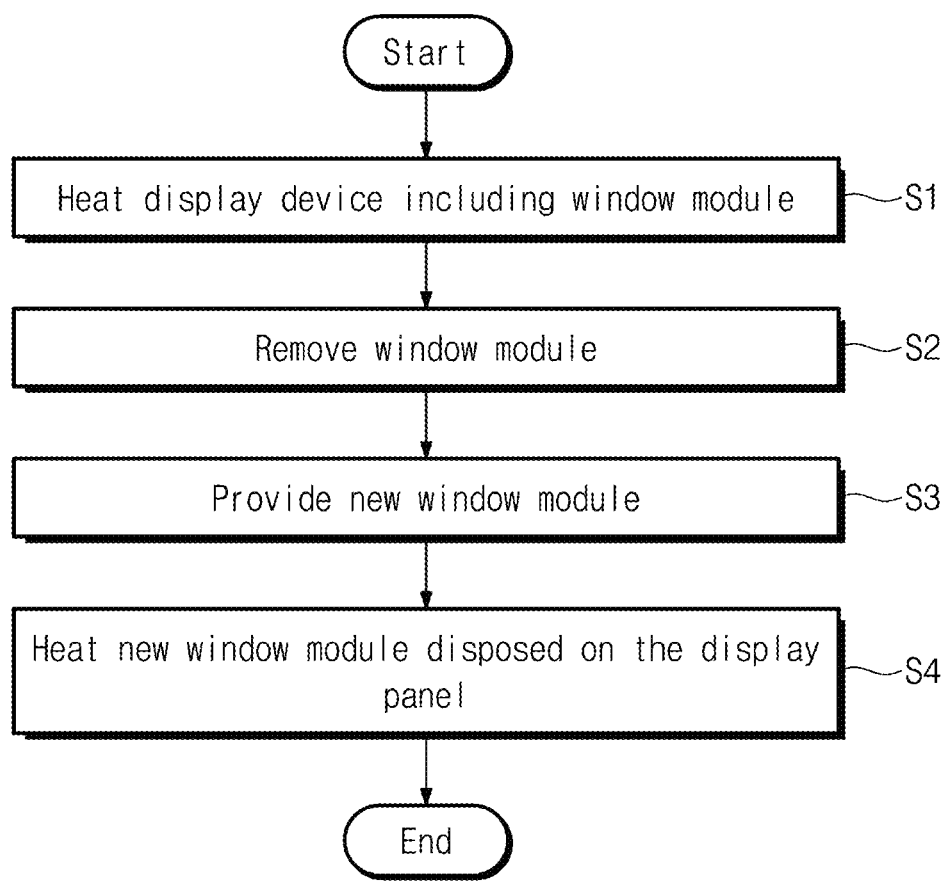
FIG. 8 is a flow chart illustrating an embodiment of a method of replacing a window module, according to the invention.
Figure 9A:
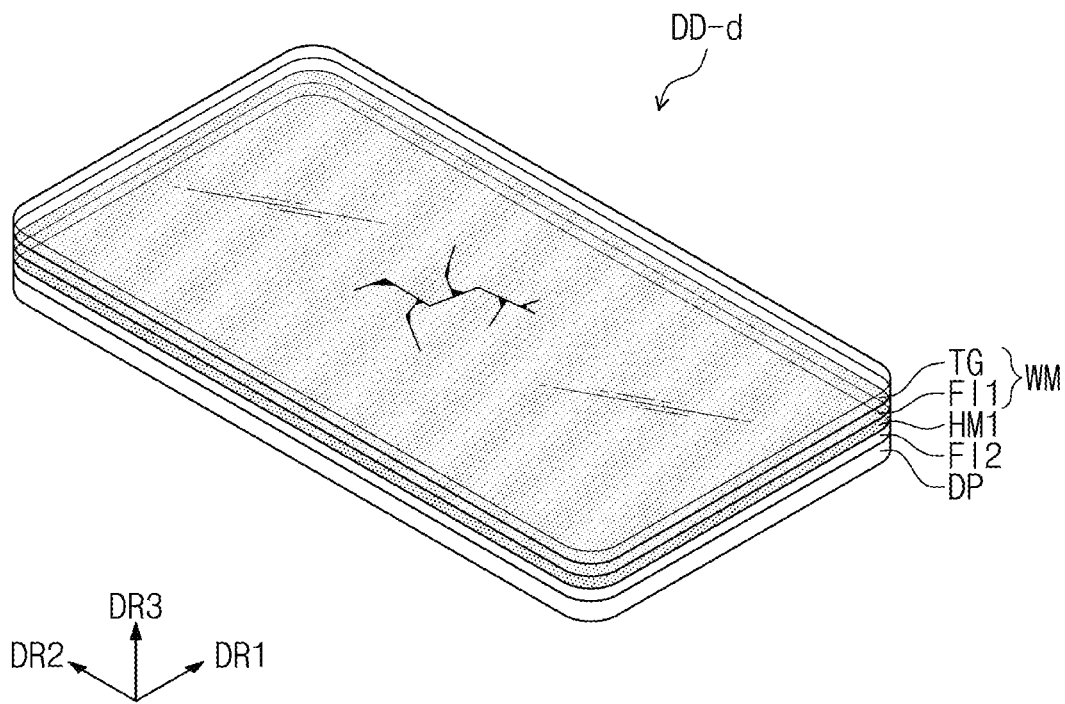
FIG. 9A is a perspective view illustrating an embodiment of a display device which is in a state before a window module replacement according to the invention.
Figure 9B:
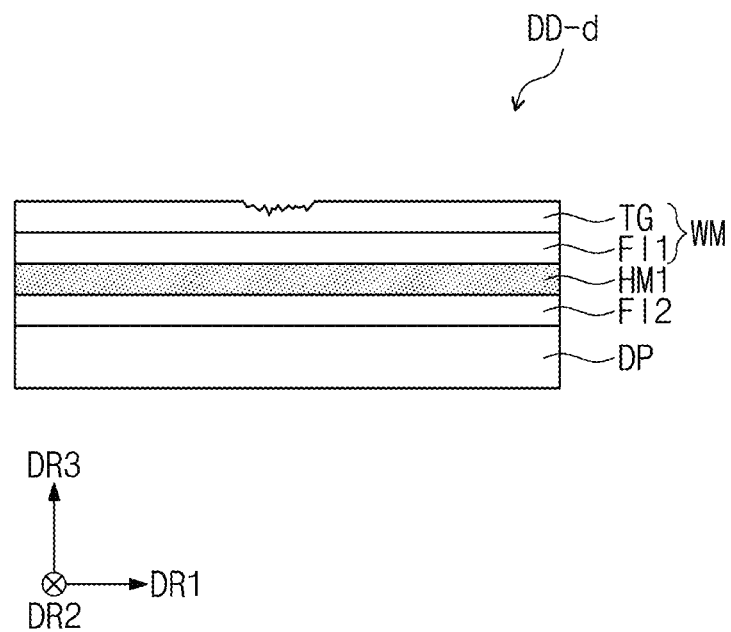
FIG. 9B is a cross-sectional view illustrating an embodiment of a display device which is in a state before a window module replacement according to the invention.

FIG. 8 is a flow chart illustrating an embodiment of a method of replacing a window module, according to the invention. FIG. 9A is a perspective view illustrating an embodiment of a display device according to the invention, and FIG. 9B is a cross-sectional view illustrating the display device of FIG. 9A. FIG. 10A to 10E are cross-sectional views illustrating an embodiment of a method of replacing a window module, according to the invention. Hereinafter, the method of replacing a window module will be described in more detail with reference to FIGS. 8 to 10E.

As shown in FIG. 8, the method of replacing a window module may include heating a display device including a window module (in S1), removing the window module from a display panel (in S2), providing a new window module including a second hot melt adhesive layer (in S3), and heating the new window module disposed on the display panel (in S4).

FIG. 9A is a perspective view illustrating an embodiment of a display device, to which the heating of the display device (in S1) will be provided, and FIG. 9B is a cross-sectional view illustrating the display device of FIG. 9A. The display device DD, from which the window module will be replaced by a new one, may include the display panel DP, the second functional film FI2, a first hot melt adhesive layer HM1, and the window module WM and the window module WM may be broken.

The window module WM may include the first functional film FI1 and the thin glass layer TG. As shown in FIGS. 9A and 9B, the thin glass layer TG may be broken by an external impact, and in this case, the broken thin glass layer TG may be replaced by the window module replacing method.

The window module replacing method may not be limited to a display device DD-d, in which the second functional film FI2 is disposed on the display panel DP and may be applied to various display devices described in the above embodiments.

Figure 10A:
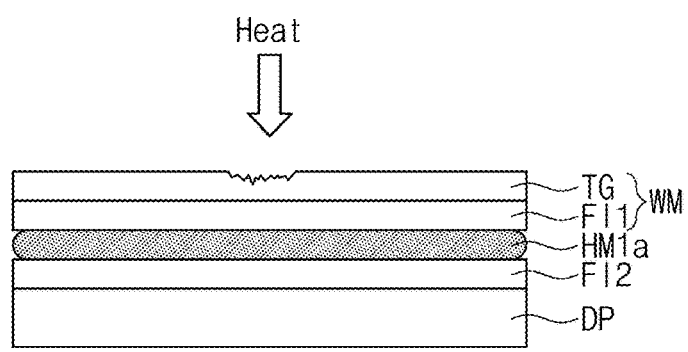
FIG. 10A is a cross-sectional view illustrating an operation of a window module replacing method.
Figure 10A:
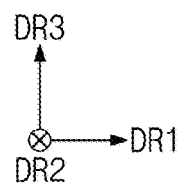

FIG. 10A is a cross-sectional view illustrating the operation S1 of heating the display device including the window module. As a result of the heating, the first hot melt adhesive layer HM1 may be melted to be in a liquid state. FIG. 10A illustrates the first hot melt adhesive layer HM1a, which is melted by the heating.

For the heating of the display device DD, heat may be provided to the window module WM through a top surface thereof. This is because, when the heat is upwardly provided from a region below the display panel DP, the display panel DP may be directly affected by the heat and may be damaged.

In the operation S1 of heating the display device, a heating temperature may be higher than a melting temperature of the first hot melt adhesive layer HM1. In an embodiment, the melting temperature of the first hot melt adhesive layer HM1 may be higher than about 85° C., and in this case, the heating temperature may range from about 85° C. to about 120° C., for example. When the heating temperature is lower than about 85° C., the first hot melt adhesive layer HM1 may not be sufficiently melted, for example. When the heating temperature is higher than about 120° C., the display device DD may be thermally damaged.

When the thin glass layer TG and the hot melt adhesive layer HM are in contact with each other without the first functional film FI1 interposed therebetween, broken pieces from the thin glass layer TG may be mixed with the hot melt adhesive layer HM1a in the melted state. In this case, composition of the hot melt adhesive layer HM1a in the melted state may be changed, so property of the hot melt adhesive layer HM1a in the melted state may be affected, and thus, there may be a difficulty in removing the window module WM from the display panel DP.

Figure 10B:
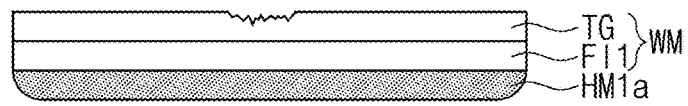
FIG. 10B is a cross-sectional view illustrating an operation of a window module replacing method.
Figure 10B:
Figure 10B:
Figure 10B:
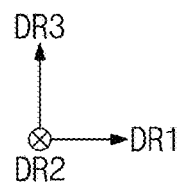

FIG. 10B is a cross-sectional view illustrating the operation S2 of removing the window module from the display panel. Since the window module WM is attached to the first hot melt adhesive layer HM1a in the melted state, the window module WM may be easily removed from the display panel DP. Thus, it may be possible to remove the window module WM, without any damage of the display panel DP.

As shown in FIG. 10B, the display device DD-d (refer to FIG. 9B) may further include the second functional film FI2 on the display panel DP. The second functional film FI2 may protect the display panel DP from the first hot melt adhesive layer HM1a in the melted state. However, in an embodiment, the second functional film FI2 may be omitted.

The first hot melt adhesive layer HM1a in the melted state may be adhered to the bottom surface of the window module WM and thus may be removed along with the window module WM. However, a melted portion of the first hot melt adhesive layer HM1a may be left on the display panel DP. The remaining melted portion of the first hot melt adhesive layer HM1a may be completely removed from the display panel DP in advance before disposing a new window module NWM (e.g., refer to FIG. 10C), but in an embodiment, the removal of the remaining melted portion may be omitted.

Figure 10C:
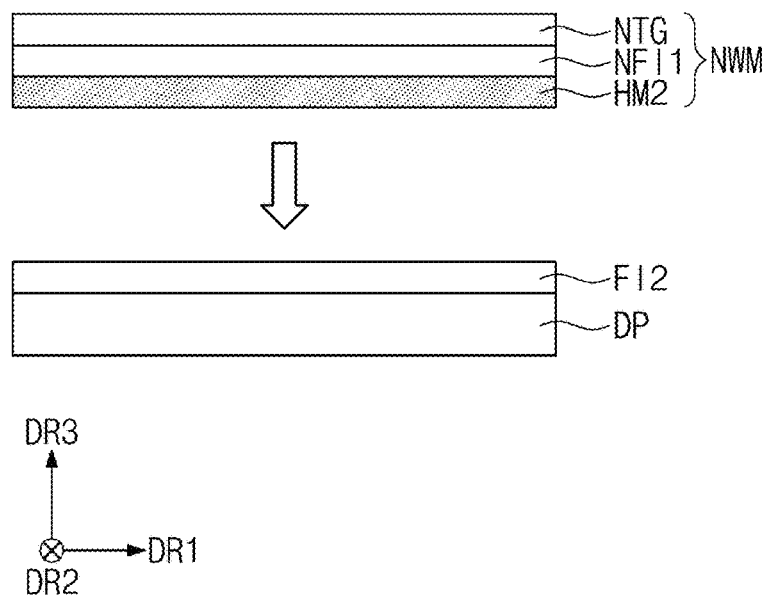
FIG. 10C is a cross-sectional view illustrating an operation of a window module replacing method.

FIG. 10C is a cross-sectional view illustrating the operation S3 of providing a new window module including a second hot melt adhesive layer. The new window module NWM may include a new thin glass layer NTG, a new first functional film NFI1, and a second hot melt adhesive layer HM2. The second hot melt adhesive layer HM2 may be disposed below the new first functional film NFI1.

The new window module NWM may be provided on the display panel DP. The second hot melt adhesive layer HM2 of the new window module NWM may be provided to face the top surface of the display panel DP.

Figure 10D:
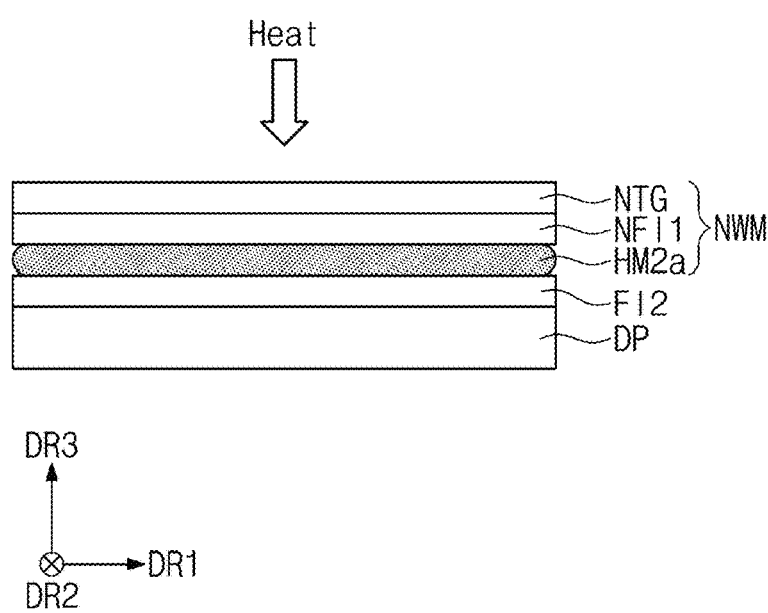
FIG. 10D is a cross-sectional view illustrating an operation of a window module replacing method.

FIG. 10D is a cross-sectional view illustrating the operation S4 of heating the new window module disposed on the display panel. The second hot melt adhesive layer HM2, which is disposed on the display panel DP after the operation S3, may be melted and be in liquid state by the heating. FIG. 10D illustrates the second hot melt adhesive layer HM2a, which is melted by the heating.

Heat may be provided to the new window module NWM through a top surface of thereof. This is because, when the heat is upwardly provided from a region below the display panel DP, the display panel DP may be directly affected by the heat and may be damaged.

In the operation S4 of heating the new window module disposed on the display panel, a heating temperature may be higher than a melting temperature of the second hot melt adhesive layer HM2. In an embodiment, the melting temperature of the second hot melt adhesive layer HM2 may be higher than about 85° C., and in this case, the heating temperature may range from about 85° C. to about 120° C., for example.

The second hot melt adhesive layer HM2 may consist of or include a material that is the same as or different from that of the first hot melt adhesive layer HM1. Thus, the melting temperature of the second hot melt adhesive layer HM2 may be substantially equal to or different from the melting temperature of the first hot melt adhesive layer HM1.

In an embodiment, the melted portion of the first hot melt adhesive layer HM1a may be completely remove in the operation show in FIG. 10B, and then, the second hot melt adhesive layer HM2 may be disposed on the display panel DP. However, in another embodiment, the second hot melt adhesive layer HM2 may be disposed on the display panel DP, on which the melted portion of the first hot melt adhesive layer HM1a is partially left. In this case, a material constituting the left portion of the first hot melt adhesive layer may be melted and may be mixed with the second hot melt adhesive layer HM2a, which is melted in the heating operation S4 of FIG. 10D. They may be consolidated together to form the second hot melt adhesive layer HM2 (e.g., refer to FIG. 10E).

The second hot melt adhesive layer HM2a in the melted state may be consolidated as the process temperature is lowered below its melting temperature. To consolidate the second hot melt adhesive layer HM2a, a display device with the new window module NWM may be laid at room temperature.

Figure 10E:
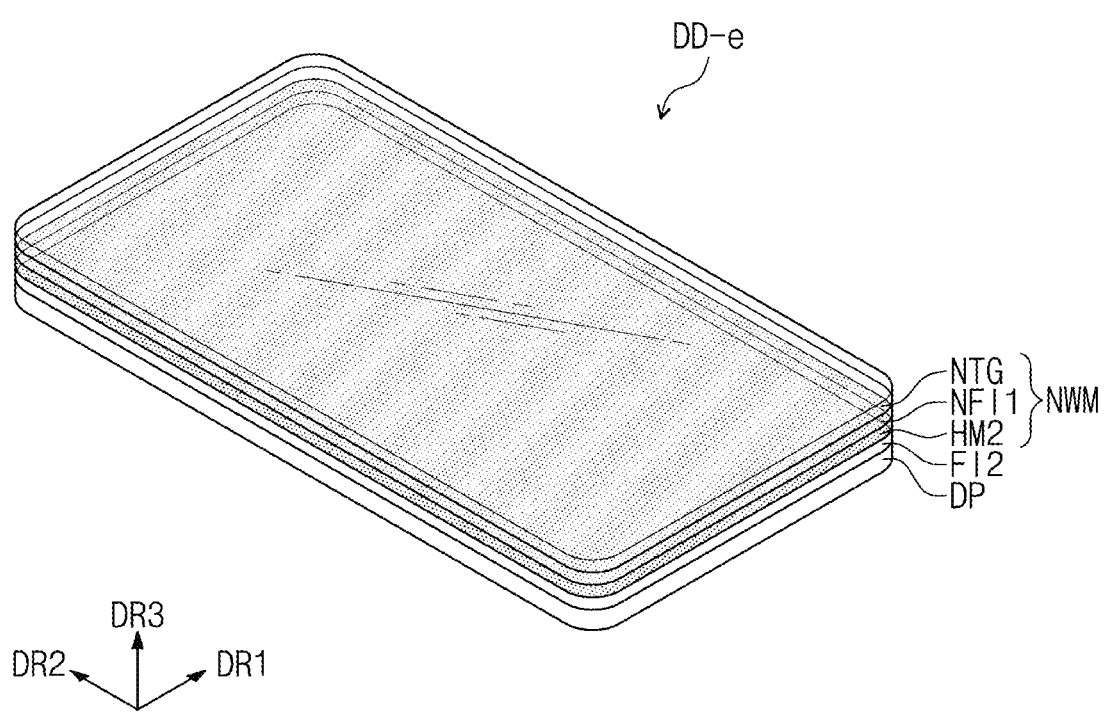
FIG. 10E is a cross-sectional view illustrating an operation of a window module replacing method.

As shown in FIG. 10E, as a result of the consolidation of the second hot melt adhesive layer HM2a, the new window module NWM may bond to the display panel DP. In the case where the second functional film FI2 is provided on the display panel DP, the second functional film FI2 may bond to the new window module NWM while being in contact with the second hot melt adhesive layer HM2.

In the display device DD-e provided with the replaced new window module NWM, the second hot melt adhesive layer HM2 may be formed to have a thickness of 1 μm or thicker. When the thickness of the second hot melt adhesive layer HM2 is less than 1 μm, elements adhered to the second hot melt adhesive layer HM2 may be easily detached from the second hot melt adhesive layer HM2, even at room temperature.

The new window module NWM may include a new thin glass layer NTG and a new first functional film NFI2. By using the window module replacing method, a damaged thin glass layer may be easily replaced with a new thin glass layer. In addition, even when not only the thin glass layer TG but also the first functional film FI1 are damaged, they may be easily and effectively replaced by the window module replacing method. In an embodiment, the first functional film FI1 may include a polarization film, and in this case, a damaged polarization film may be replaced by the window module replacing method.

Since the window module may be simply and economically replaced by the window module replacing method, it is possible to increase user convenience and reduce user's burden on the replacement cost. Even when the new thin glass layer NTG is damaged again, it may be replaced using the window module replacing method.

In the display device in an embodiment of the invention, a hot melt adhesive layer may be disposed between a display panel and a window module with a thin glass layer, and thus, it may be possible to simply and economically replace the thin glass layer, which is easily broken by an external impact, without damage of the display panel.

The window module replacing method in an embodiment of the invention may include operations of heating a display device, removing a window module, placing a new window module, and heating the resulting structure. In this case, it may be possible to simply and economically replace the window module with the new window module, without damage of a display panel disposed below a hot melt adhesive layer.

In an embodiment of the invention, a window module, which is provided as a part of a display device, may be simply and economically replaced, without damage of a display panel.

While embodiments of the invention have been particularly shown and described, it will be understood by one of ordinary skill in the art that variations in form and detail may be made therein without departing from the spirit and scope of the attached claims.

What is claimed is:

1. A display device, comprising:
   a display panel;
   a thin glass layer disposed on the display panel;
   a hot melt adhesive layer disposed between the display panel and the thin glass layer;
   a functional film disposed between the hot melt adhesive layer and the thin glass layer, and contacting a surface of the hot melt adhesive layer facing the thin glass layer; and
   an adhesion layer which is disposed between the thin glass layer and the functional film and attaches the thin glass layer and the functional film in a state in which a temperature higher than a melting temperature of the hot melt adhesive layer is applied and the display panel and the thin glass layer are separated from each other,
   wherein the functional film includes at least one of a polyimide film and a polyvinylalcohol film.

2. The display device of claim 1, wherein the hot melt adhesive layer has a melting temperature of about 85 degrees Celsius or higher.

3. The display device of claim 1, wherein the hot melt adhesive layer has an optical transmittance of about 80 percent or higher.

4. The display device of claim 1, wherein the hot melt adhesive layer has a thickness of 1 micrometer or thicker.

5. The display device of claim 1, wherein the thin glass layer has a thickness of 25 micrometers to 1 millimeter.

6. The display device of claim 1, wherein the functional film comprises a protection film or a polarization film.

7. The display device of claim 1, wherein the display panel is flexible.

8. A display device, comprising:
 a display panel;
 a thin glass layer disposed on the display panel;
 a hot melt adhesive layer disposed between the display panel and the thin glass layer;
 a first functional film in contact with a first surface of the hot melt adhesive layer facing the thin glass layer;
 a first adhesion layer which is disposed between the display panel and the second functional film and attaches the display panel and the second functional film in a state in which a temperature higher than a melting temperature of the hot melt adhesive layer is applied and the display panel and the thin glass layer are separated from each other;
 a second functional film in contact with a second surface of the hot melt adhesive layer opposite to the first surface of the hot melt adhesive layer; and
 a second adhesion layer which is disposed between the thin glass layer and the first functional film and attaches the thin glass layer and the first functional film in the state,
 wherein at least one of the first functional film and the second functional film includes at least one of a polyimide film and a polyvinylalcohol film.

9. The display device of claim 8, wherein the hot melt adhesive layer has a melting temperature of about 85 degrees Celsius or higher.

10. The display device of claim 8, wherein the hot melt adhesive layer has an optical transmittance of about 80 percent or higher.

11. The display device of claim 8, wherein the hot melt adhesive layer has a thickness of about 1 micrometer or greater.

12. The display device of claim 8, wherein the thin glass layer has a thickness of about 25 micrometers to about 1 millimeter.

13. The display device of claim 8, wherein each of the first functional film and the second functional film comprises at least one of a protection film and a polarization film.

14. The display device of claim 8, wherein the first functional film and the second functional film include a same material.

15. The display device of claim 8, wherein the display panel comprises:
 a substrate;
 a circuit layer disposed on the substrate;
 a light-emitting element layer disposed on the circuit layer; and
 an encapsulation layer disposed on the light-emitting element layer.

* * * * *